United States Patent [19]
Uchida et al.

[11] Patent Number: 5,942,376
[45] Date of Patent: Aug. 24, 1999

[54] SHELF-STABLE LIQUID METAL ARYLKETONE ALCOHOLATE SOLUTIONS AND USE THEREOF IN PHOTOINITIATED PATTERNING OF THIN FILMS

[75] Inventors: Hiroto Uchida; Nobuyuki Soyama, both of Colorado Springs, Colo.; Kensuke Kageyama; Katsumi Ogi, both of Saitama, Japan; Michael C. Scott, New South Wales, Australia; Larry D. McMillan; Carlos A. Paz de Araujo, both of Colorado Springs, Colo.

[73] Assignees: Symetrix Corporation, Colorado Springs, Colo.; Mitsubishi Materials Corporation, Japan

[21] Appl. No.: 08/911,098

[22] Filed: Aug. 14, 1997

[51] Int. Cl.[6] .................................................... B05D 3/06
[52] U.S. Cl. ..................... 430/330; 430/198; 430/311; 505/440; 505/445; 505/734; 427/63; 427/555; 427/558; 427/553; 65/17.2; 65/17.5
[58] Field of Search .................... 430/198, 311, 430/330; 505/440, 445, 734; 427/555, 63, 558, 553; 65/17.5, 17.2

[56] References Cited

U.S. PATENT DOCUMENTS

| | | | |
|---|---|---|---|
| 4,880,770 | 11/1989 | Mir et al. ................................. | 427/63 |
| 4,952,556 | 8/1990 | Mantese et al. ......................... | 427/555 |
| 5,001,110 | 3/1991 | Nonaka et al. .......................... | 427/63 |
| 5,041,420 | 8/1991 | Nagash et al. ........................... | 427/63 |
| 5,281,447 | 1/1994 | Brady et al. ............................. | 427/553 |

OTHER PUBLICATIONS

Nakao, et al.—Micro–Patterning of $PbZr_xTi_{1-x}O_3$ Thin Films Prepared by Photo Sensitive Sol–Gel Solution, Jpn. Appl. Phys. vol. 32 (1993) pp. 4141–4143.

Soyama, et al.—Formation of Fine–Patterned Ferroelectric Thin Film From Sol–Gel Solution Containing A Photo–Sensitive Water–Generator, (Abstract presented at the International Symposium on Applied Ferroelectrics—1994).

Soyama, et al.—Formation of Fine–Patterned Ferroelectric Thin Film From Sol–Gel Solution Containing A Photo–Sensitive Water–Generator, (Article—Proceedings of the International Symposium on Applied Ferroelectrics—1995).

*Primary Examiner*—Martin Angebranndt
*Attorney, Agent, or Firm*—Duft, Graziano & Forest, P.C.

[57] ABSTRACT

Solution films of a photosensitive metal arylketone alcoholate are micro-patterned by exposure to ultraviolet radiation under a mask. The resultant patterns are developed in an apolar solvent and annealed to provide thin film metal oxides for use in integrated circuits.

16 Claims, 6 Drawing Sheets

SHELF-STABLE LIQUID METAL ARYLKETONE ALCOHOLATE SOLUTIONS AND USE THEREOF IN PHOTOINITIATED PATTERNING OF THIN FILMS

BACKGROUND OF THE INVENTION

1. Field of the Invention

The present invention relates to the field of liquid or vapor metal-organic solutions that are used to form solid metal oxide thin films. The liquid solutions facilitate simplified processing of microelectronic devices and optical coatings because the films can be patterned by exposure to ultraviolet radiation.

2. Statement of the Problem

The production of microelectronic devices, e.g., integrated circuits, often requires patterning of circuit components, such as metal oxides and electrodes. The patterning process is a complicated and expensive one that normally requires the application of a photo resist layer, exposure of the resist through a mask to define the device pattern, etching to remove thin film materials, and removal of the remaining resist in a solvent wash. A simpler and less expensive patterning process is needed to avoid process complexity.

The patterning process can be simplified through the use of a photosensitive precursor solution. Nakao et al, *Micro-Patterning of $PbZr_xTi_{1-x}O_3$ Thin films Prepared By Photo Sensitive Sol-Gel Solution*, 32 Jpn. J. Appl. Phys. 4141–4143 (1993), teaches the boiling of a mixture including of lead acetate trihydrate with 2-methoxyethanol to dehydrate the trihydrate. Zirconium tetra n-butoxide and titanium tetra isopropoxide are added to the partially cooled solution to commence a complexation reaction. Acetyl acetone is added to the mixture to quench the complexation and stabilize the solution. Water is added to the solution to facilitate hydrolysis. The solution is distilled to obtain 10% PZT in 2-methoxyethanol, which yields high resolution micropatterns after ultraviolet irradiation and calcination in an oxygen furnace. The Nakao et al reference reports that 0.6 micron PZT dots are produced by the exposure of a sol-gel precursor to ultraviolet light. The patterned film is developed in a water bath to remove unpolymerized portions of the film.

The Nakao et al irradiation method does not overcome problems that are inherent to the use of sol-gel solutions, namely, the difficulties of long-term storage and exposure to water. The Nakao et al solution uses sol-gel solutions that rely upon the condensation polymerization of alkoxide ligands to gel the solution. A problem with this type of solution is that it must be prepared on-site immediately prior to use because the condensation reaction proceeds until the solution can no longer be used. Thus, it is difficult or impossible to prepare large quantities of these solutions at a plant specializing in these materials. The need to prepare these solutions on-site adds expense and complexity. Additionally, even on-site, variations in the degree of polymerization over time are ultimately associated with differences in PZT film thicknesses derived from these solutions.

Soyama et al, *The Formation of a Fine-Patterned Ferroelectric Thin-Film From a Sol-Gel Solution Containing a Photo-Sensitive Water Generator*, Proceedings Of The International Symposium On Applied Ferroelectrics (1995), reports the addition of o-nitrobenzyl alcohol to a PZT sol-gel solution. The o-nitrobenzyl alcohol undergoes a photolytic reaction to generate water upon exposure to ultraviolet light. Soyama et al apply the solution to a silicon substrate and expose it to masked ultraviolet light, which polymerizes the exposed portion of the solution. The mask prevents polymerization of selected portions of the film by blocking ultraviolet radiation. The unexposed portions of the film on the substrate do not polymerize, and are removed by rinsing in a developer solution containing 2-methoxyethanol and 2-propanol. The resultant pattern has a resolution down to at least 10 to 20 microns.

The Soyama et al article reports a significant advance in the art, but does not overcome the fundamental drawbacks of sot-gel solutions. These drawbacks include a lack of stability in the sol-gel solutions after they are made ready for use. Furthermore, the resolution or shape of the pattern improves with exposure time, but needs improvement.

Uchida et al, *Characterization Of Self-Patterned $SrBi_2Ta_2O_9$ Thin Films From Photo-sensitive Solutions*, International Symposium On Integrated Ferroelectrics (1996) reports the patterning of strontium bismuth tantalate films that were prepared from a proprietary process using a photosensitive precursor solution. Photomicrographs of the resultant thin films show the formation of dot patterns, e.g., of a 1×1 micron size. The patterns sometimes have tapered edges that lack sharp corners and show signs of bubbling or porosity.

Sol-gel processes have been used to make thin film ferroelectrics including lead zirconium titanate ("PZT") on gallium arsenide and silicon substrates. Melnick et al, *Process Optimization and Characterization of Device Worthy Sol-Gel Based PZT for Ferroelectric Memories*, 109 Ferroelectrics pp. 1–24 (1990), shows that the most common choice of sol-gel precursor is a metal alkoxide of the form $M(OR)_X$, wherein M is a metal of valence X and R is an alkyl group. Metal alkoxides are typically produced by dissolving a metal chloride in an alcohol to yield a metal alkoxide and hydrochloric acid. An alternative reaction includes the addition of ammonia to the metal chloride and the alcohol to yield the metal. alkoxide and ammonium chloride. Metal alkoxides and sol-gels are most often prepared in an alcohol solvent, and unwanted byproducts are removed by distillation.

Metal alkoxide solutions are susceptible to condensation reactions that polymerize the solution. The mere addition of water leads to the partial hydrolysis:

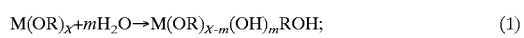

wherein M, X, and R are defined above and m is an integer less than or equal to X. If m=X, then the reaction (1) is a total hydrolysis, which is followed by either a water condensation (2) or an alcohol condensation (3):

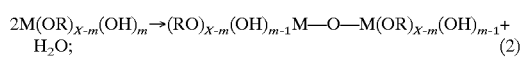

or

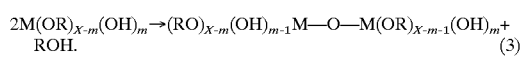

Sol-gel solutions are hydrolyzed to prevent cracking of the films during the drying and annealing of the precursor film. Some hydrolysis is necessary to prevent cracking. Melnick et al at page 22 reports that sol-gel solutions produced crack-free films when they were hydrolyzed with an h-factor of 1.43 or better. Acid or base may be added to facilitate hydrolysis. Hydrolysis under highly basic conditions proceeds by a nucleophilic reaction that leads to dense, highly branched, crosslinked polymers. Hydrolysis under acidic conditions proceeds under an electrophillic reaction, which produces partially hydrolyzed monomers that condense into a more linear, tightly crosslinked network.

Sol-gels typically have a very short shelf life, and must be made ready for use just prior to the time that they are actually needed. The condensation reactions of equations (1)–(3) above produce alcohol and water byproducts that, in turn, lead to additional condensation. It may only require a few hours for a sol-gel to degrade to the point where it is no longer useful. This occurs because variations in the degree to which the solution has hydrolyzed are associated with corresponding variations in the thickness and quality of the resultant metal oxide. These variations are unacceptable because the corresponding films have markedly different electrical or optical properties from one device to another.

Metal alkoxides exhibit hydrolytic reactivity, as well as some photoreactivity, both of which result in water production. Thus, extreme precautions must be taken to avoid introducing or forming any water whatsoever into a metal alkoxide solution, or else the ensuing polymerization can ruin the solution for its intended use. These precautions include a need to protect the solutions from exposure to atmospheric water vapor. As a practical matter, sol-gels must be prepared in small batches on an as-needed basis. Small scale production also leads to variations in film quality, and this circumstance hinders the widespread commercial acceptance of sol-gels.

There remains a true need for high resolution photosensitive sol-gel solutions that have a long shelf life.

SOLUTION

The present invention overcomes the problems mentioned above by providing a photo-patterning sol-gel class of solution that is stabilized against hydrolysis by bonding a protecting group to the hydrolytically inclined metal. An arylketone alcoholate protecting group provides steric hindrance and coordinate bonding that prevents the metal from reacting with solution water until such time as exposure to ultraviolet radiation eliminates the arylketone portion of the protecting group. Only then is the resultant metal alkoxide susceptible to hydrolytic reactions of the type described above in equations (1)–(3). Photosentitive solutions according to the present invention are generally shelf-stable for a year or more.

The broadest concept of the invention involves stabilizing a sol-gel against hydrolysis by the use of a photosensitive material having a protecting group that prevents a metal from undergoing hydrolysis. The photosensitive material includes an aromatic or aryl group that provides steric hindrance at the metal to prevent hydrolysis, a ketone that further prevents hydrolysis by coordinate bonding with the metal, and an alkoxide portion that connects the metal to the ketone. Exposure to electromagnetic radiation breaks the alkoxide-to-ketone bond for elimination of both the aromatic portion and the ketone. The resultant metal alkoxide film is susceptible to hydrolysis, and eventually patterns itself by a condensation reaction with solution water. Portions of the solution film that have not been exposed to ultraviolet light remain unpolymerized and are rinsed away in a developer bath.

The metal of the photosensitive material is preferably bonded to a second group or ligand, in addition to the protecting group. Materials that may be used as this second group include alkoxides, β-diketonates, carboxylates, β-ketoesters, and mixtures of these materials. The β-diketonates, carboxylates, and β-ketoesters further stabilize the solution because they resist hydrolysis. The second group can also be an alkoxide that is subject to hydrolysis once the protecting group is removed by the action of ultraviolet radiation. The steric hindrance and coordinate bonding of the protecting group also protects the alkoxide from hydrolysis until the protecting group is removed by the action of electromagnetic radiation. The presence of additional alkoxide ligands is sometimes desirable because it increases the degree of polymerization in the patterned solution.

The metal of the photosensitive material is eventually incorporated into a metal oxide thin film. Accordingly, the photosensitive solution is mixed to yield the desired metal oxide upon annealing of the photosensitive solution. The metal oxide may include only a single type of metal, or a plurality of metals may be added to form complex metal oxides. The most preferred complex metal oxides to be derived from these solutions are layered superlattice materials and perovskites. Layered superlattice materials include the materials described in U.S. Pat. No. 5,434,102, which is incorporated by reference to the same extent as though fully disclosed herein. The most preferred layered superlattice materials are strontium bismuth tantalate $SrBi_2Ta_2O_9$ and strontium bismuth niobium tantalate, especially, $Sr_{0.8}Bi_{2.2}(Nb_{0.56}Ta_{1.44})O_{9.1}$. Perovskites are well known materials having an $ABO_3$ structure wherein A is an A-site metal and B is a B-site metal in the perovskite lattice. Substitutions may be made for A-site and B-site materials, e.g., $AA'BB'O_3$ wherein A' and B' are A-site and B-site metals that are different from A and B.

The preferred liquid solution is made by reacting a metal β-diketonate, metal alkoxide, metal carboxylate, or metal β-ketoester, with an arylketone alcohol precursor that forms the protecting group. Thus, the metal is bonded to the protecting group as the alcohol site of the protecting group precursor reacts to substitute for one of the β-diketonate, alkoxide, carboxylate, or β-ketoester ligands.

The liquid solution is diluted to an appropriate molarity by the addition of a solvent. The liquid solution is preferably capable of yielding from 0.05 to 0.5 moles of metal oxide per liter of solution, which concentration is determined according to the empirical formula of the metal oxide to be derived from the solution. The concentration even more preferably ranges from 0.1 to 0.2 moles per liter when the solution is to be used for making thin films of integrated circuit quality. The most preferred solvent is 1-methoxy-2-propanol. Apolar solvents may also be used, but these can require the addition of polar cosolvents to enhance solubility of the protected metal complexes.

The liquid solution is applied to a substrate to form a solution film. Preferred modes of deposition include spin-on deposition, misted deposition, and evaporation of the solution liquid to produce a vapor. The solution film is subjected to drying and annealing steps to yield a crack-free solid crystal formed on the substrate. The anneal process yields a metal oxide when the anneal occurs under an oxygen atmosphere. Similarly, an anneal performed under a hydrogen sulfide atmosphere yields a metal sulfide. Thus, the choice or selection of an anneal atmosphere determines the type of material to be derived from the process.

Other features, objects, and advantages of the present invention will be apparent to those skilled in the art upon a reading of the description below together with the accompanying drawings.

DETAILED DESCRIPTION OF THE PREFERRED EMBODIMENT

Figure 1:
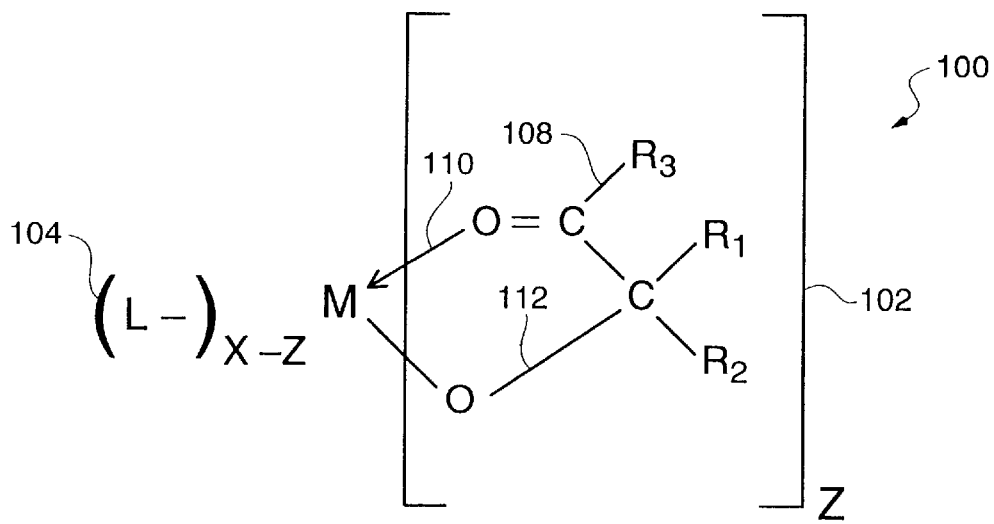
FIG. 1 depicts a first preferred molecule for use in photosensitive solutions according to the present invention.

FIG. 1 depicts a preferred metal arylketone alcoholate molecule 100 for use in a protected photosensitive solution according to the present invention. Molecule 100 includes a protecting group 102 and a second group 104. Protecting group 102 includes an aromatic portion $R_3$, a ketone portion 108 with coordinate bonding 110 to metal M, and an alkoxide portion 112 bonded to metal M and ketone portion 108.

Figure 2:
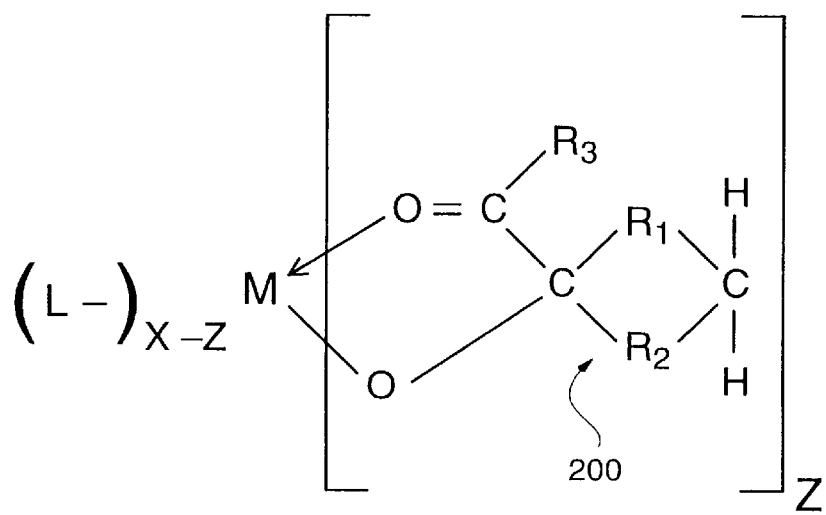
FIG. 2 depicts a second preferred molecule for use in photosensitive solutions according to the present invention.

In FIG. 1, M is a metal having a valence X; Z is an integer less than or equal to X; L is an alkoxy, carboxylate, β-diketonate, or β-ketoester ligand preferably having from one to eleven carbon atoms; $R_1$ and $R_2$ may be hydrogen but are preferably alky or alkenyl groups each having from one to eleven carbon atoms, and are most preferably alkyl. $R_3$ is aromatic or aryl, and is most preferably phenyl. $R_3$ hydrogen atoms on the aromatic ring may be substituted by amino, alkoxy, carboxyl, β-ditetonate, or β-ketoester ligands preferably having from one to eleven carbon atoms. R3 may also be an aromatic heterocyclic group, especially a thienyl, pyridyle, pyrryl, or furyl group. As shown in FIG. 2, $R_1$ and $R_2$ may bond with one another to form a cycloalkane 200. This cycloalkane is particularly preferred for the effect of additional steric hindrance.

Figure 3:
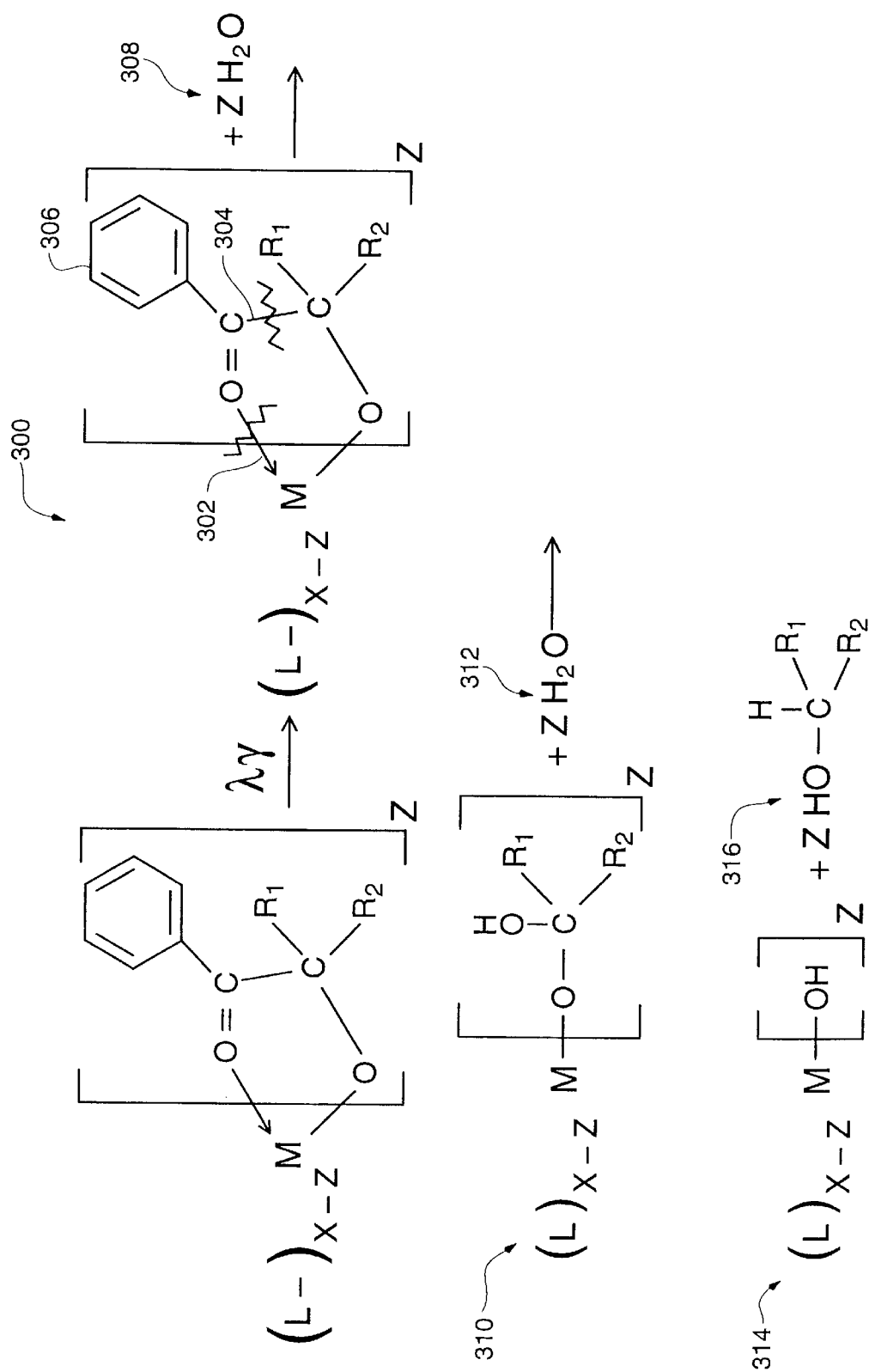
FIG. 3 depicts a photinitiated hydrolysis reaction involving the molecule of FIG. 1, wherein the molecules of FIGS. 1 and 2 are interchangeable with one another.

FIG. 3 depicts a generalized photoinitiated reaction 300 wherein ultraviolet radiation hy disrupts coordinate bond 302 and sigma bond 304 to form an aromatic ketone leaving group 306. Reaction with solution water 308 yields a metal alkoxide intermediate 310 which, in turn, reacts with more solution water to yield a metal hydroxide 314 and an alcohol 316. The resultant metal hydroxide 314 is susceptible to alcohol or water condensation by the mechanisms shown above in equations (2) and (3).

Figure 4:
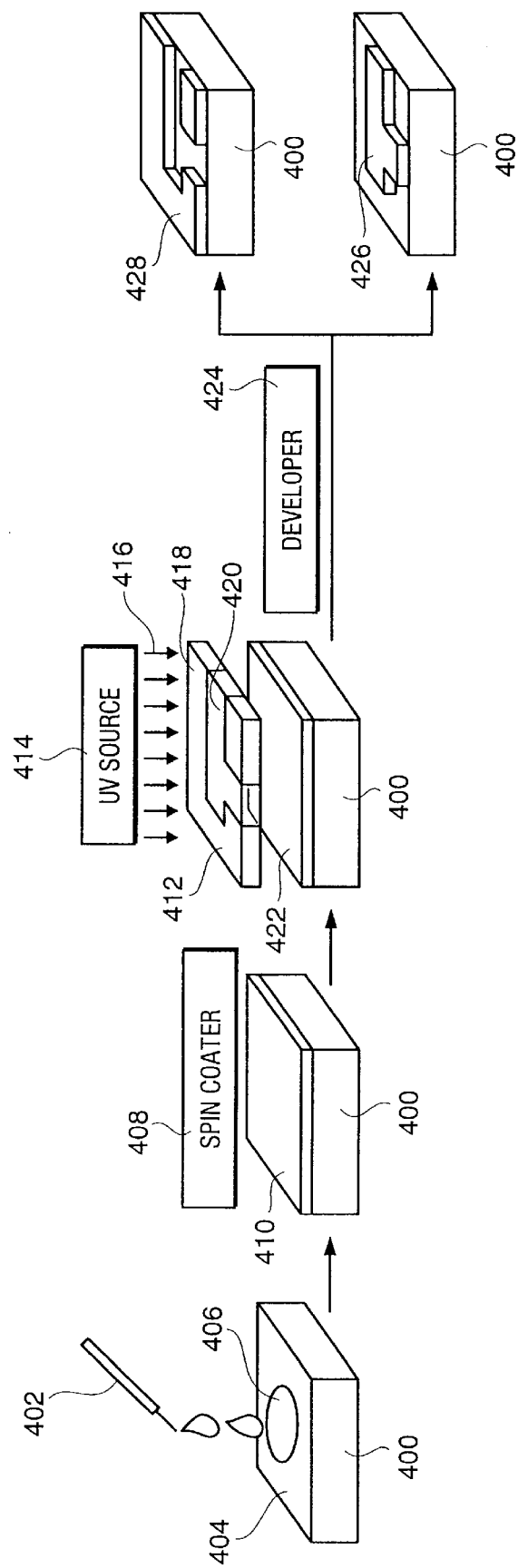
FIG. 4 depicts an integrated circuit substrate in sequential stages of photolytic thin film processing according to the present invention.

FIG. 4 depicts a substrate 400 in sequential stages of thin film formation according to the present invention. Substrate 400 is preferably a silicon substrate, but may be any type of integrated circuit or optical substrate, e.g., gallium arsenide, ruby, sapphire, or quartz glass. The term substrate is sometimes used ambiguously in this art. A "substrate" is hereby defined to mean the base supporting layer, e.g., a silicon wafer, in addition to any intervening layers that support subsequent layers. Thus, substrate 400 includes the wafer plus any other layers deposited on the wafer. FIG. 4 does not depict these other layers, but they may include platinum, titanium, silicon oxide, silicon nitride, titanium oxide, and layers of any other material that is used to form integrated circuit devices. These layers together all act as a substrate to support the thin film that is deposited according to the present invention.

A vial 402 filled with a photosensitive liquid solution is used to place drops of the solution on the surface 404 of substrate 400. These drops form a liquid film 406 having undesirable thickness variations over surface 409. The application of solution occurs in a conventional spin-coating machine 408.

After application of the solution, substrate 400 is spun at about 600 to 3000 rpm. The spinning removes the irregularities in liquid film 406 to produce a smoothed liquid film 410, which may optionally be baked at low temperatures before proceeding to subsequent steps.

A photo mask 412 is aligned with substrate 400 and positioned between substrate 400 and ultraviolet radiation source 414. Ultraviolet radiation source 414 is activated to emit ultraviolet radiation 416. Photo mask 412 blocks the portion of ultraviolet radiation impinging upon ultraviolet-blocking mask portion 418, and allows the passage of ultraviolet radiation through mask opening 420. The portion of ultraviolet radiation passing through mask opening 420 impinges upon substrate 400 to promote decomposition of the ligand and polymerize a portion of uniform film, which produces a selectively polymerized film 422. A subsequent post-bake step including treatment on a hot plate promotes decomposition of the ligand in the film and completes the polymerization.

Substrate 400 is subsequently placed in a developer 424, i.e., a tank or bath filled with a solution that rinses unpolymerized portions of selectively polymerized film 422 away from substrate 400. The development of selectively polymerized film 422 leaves a patterned polymerized film 426 atop substrate 400. Film 428 results from the development of selectively polymerized film 422 if mask 412 is altered to substitute ultraviolet-blocking structure for mask opening 420 and to substitute a mask opening for ultraviolet-blocking structure 418.

Figure 5:
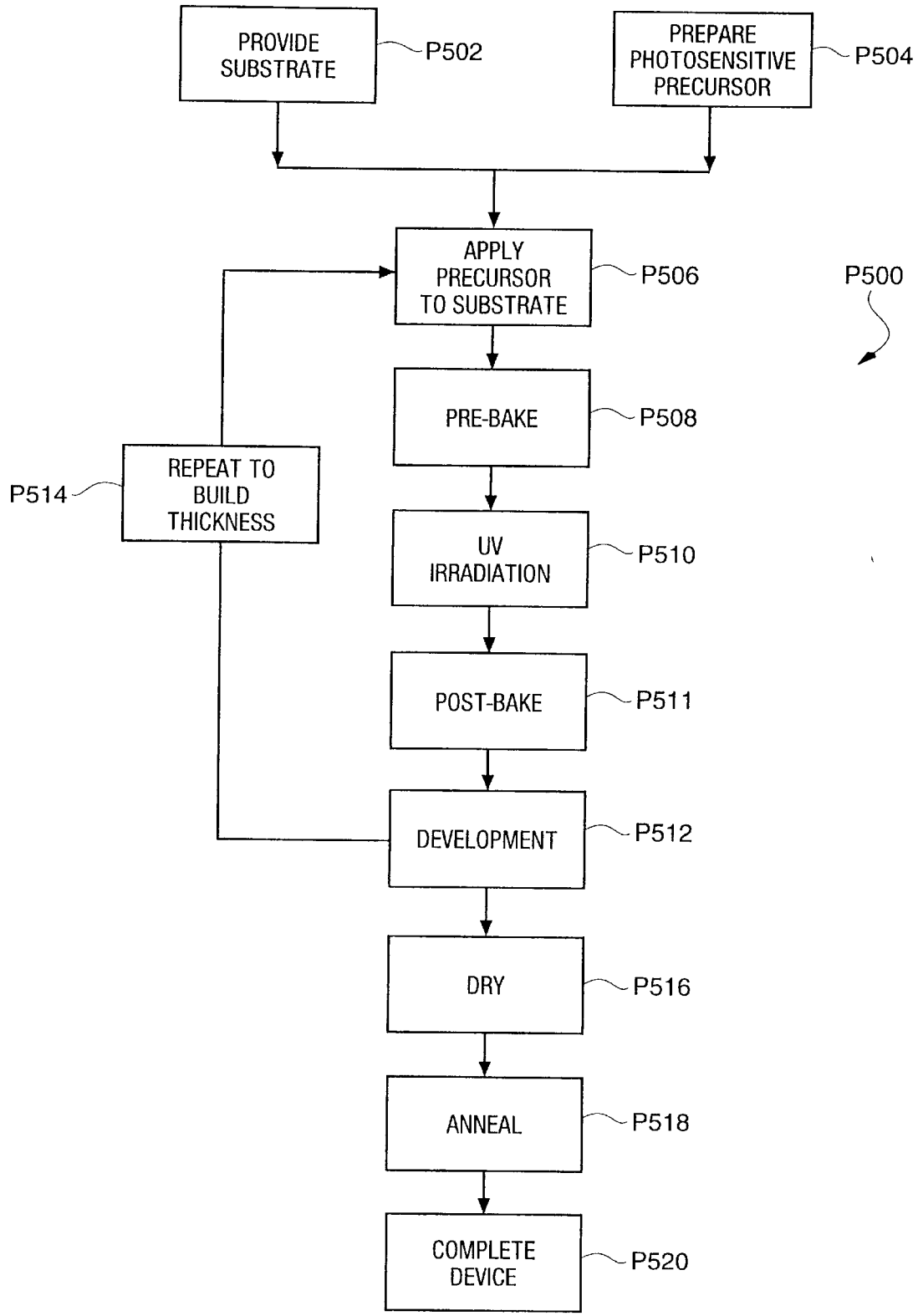
FIG. 5 depicts a schematic process diagram for use in making thin film devices in the manner of FIG. 4.

FIG. 5 depicts a process schematic diagram of the processing steps that are conducted on substrate 400. FIG. 5 provides additional detail with respect to the discussion of FIG. 4. Process P500 shows exceptionally good results when used in the production of integrated circuits.

Step P502 includes providing substrate 400. As indicated above, substrate 400 may be any type of integrated circuit substrate or optical substrate together with any layers deposited on the substrate prior to the deposition of subsequent layers.

Step P504 includes preparing a photosensitive liquid solution. The photosensitive liquid solution contains a metal arylketone alkoxide having a molecular structure as shown in FIGS. 2 and 3.

In step P506, the photosensitive liquid solution of step P504 is applied to the substrate of step P502. The preferred form of deposition of spin-on deposition in which a few drops of the photosensitive liquid solution from step P504 are applied to form film 404 as shown in FIG. 4. The substrate is subsequently spun at about 600 rpm to 3000 rpm for thirty seconds to yield the uniform film 410 as shown in FIG. 4. The most preferred rotational velocity is 1500 rpm. Other liquid deposition techniques, e.g., misted deposition techniques can also be used to deposit the liquid solution.

In step P508, the spun-on film 410 (see FIG. 4) is subjected to a pre-bake or soft-bake on a hot plate in air at a temperature ranging from 80° C. to 150° C. for one to three minutes. The most preferred pre-baking conditions are 100° C. for one minute. This prebaking step stabilizes the film for use in subsequent steps, and is also referred to as a soft-bake because the resultant film 422 (see FIG. 4) is amorphous and contains a dried solution film in a substantially unpolymerized form.

Step P510 includes exposing the dried film from step P508 to ultraviolet radiation. Deep ultraviolet radiation having a wavelength ranging from 250 nm to 300 nm is preferred, as is a total energy delivery of at least about 500 mili-Joules during the term of exposure. The radiation wavelength and energy delivery may be varied, e.g., from 1–50 mW/cm$^2$, as required for interaction with a selected solution. Prior to such exposure, mask 412 (see FIG. 4) is aligned with substrate 400 using a conventional contact aligner. The ultraviolet radiation impinges upon the solution film to cause the reactions shown in FIG. 3.

Step P511 includes post-baking of the film. This post-baking is done in air on a hot plate heated to a temperature ranging from 80° C. to 160° C. for a time ranging from 30 seconds to 180 seconds. The post-baking temperature is more preferably from 100° C. to 160° C. Post-baking furthers the polymerization reaction begun in step P510 and slowly drives off solvent or disassociated organic ligands that remain in the film.

Step P512 includes developing the selectively polymerized film by washing or rinsing the wafer with a developer solution to remove unpolymerized portions of film 422 (see FIG. 4). The developer solution is preferably an organic solvent, and is more preferably a polar organic solvent. Alcohols are particularly preferred. The most preferred developer solution is a 1:1 mixture of 2-methoxyethanol and isopropyl alcohol, which is applied at room temperature for a time ranging from ten to sixty seconds.

In step P514, steps P506–P510 are optionally repeated until the thin film (426 or 428 of FIG. 4) has reached a desired thickness. Care must be taken when aligning the mask 414 with the substrate 400 each time in step P510, or else the mask alignment error causes misalignment between the newly deposited film and the underlying film. Each application of a 0.15 molar liquid solution in step P506 increases film thickness of the final metal oxide material by about 1500Å.

Step P516 includes drying the patterned film after development. Substrate 400 is typically placed on a hot plate in air and dried at a temperature ranging from 100° to about 300° C. for a time ranging from ten seconds to five minutes. The most preferred drying procedure is a multi-staged drying procedure. The wafer bearing the patterned film is placed on a 140° C. hot plate for one minute followed by 260° C. for four minutes. The final drying step includes a brief exposure to rapid thermal processing apparatus providing 725° C. for thirty seconds under an oxygen flow of 5 cc/minute.

In step P518, substrate 100 (see FIG. 4) bearing patterned film 426 or 428 is furnace annealed at a temperature ranging from 600° to 850° C. The most preferred anneal profile is 800° C. under an oxygen flow for one hour including a ten minute ramp into a diffusion furnace and a ten minute ramp out of the furnace. The partial pressure of the oxygen ranges from 0.1 to 100 percent.

Step P520 includes completing the integrated circuit device. This completing step entails the deposition of additional layers together with the removal or patterning of the additional material, as required. For example, film portion 426 (see FIG. 4) may be the dielectric layer of an integrated circuit capacitor, the ferroelectric layer of a nonvolatile ferroelectric memory, the gate of a ferroelectric transistor, or any other integrated circuit component.

Figure 6:
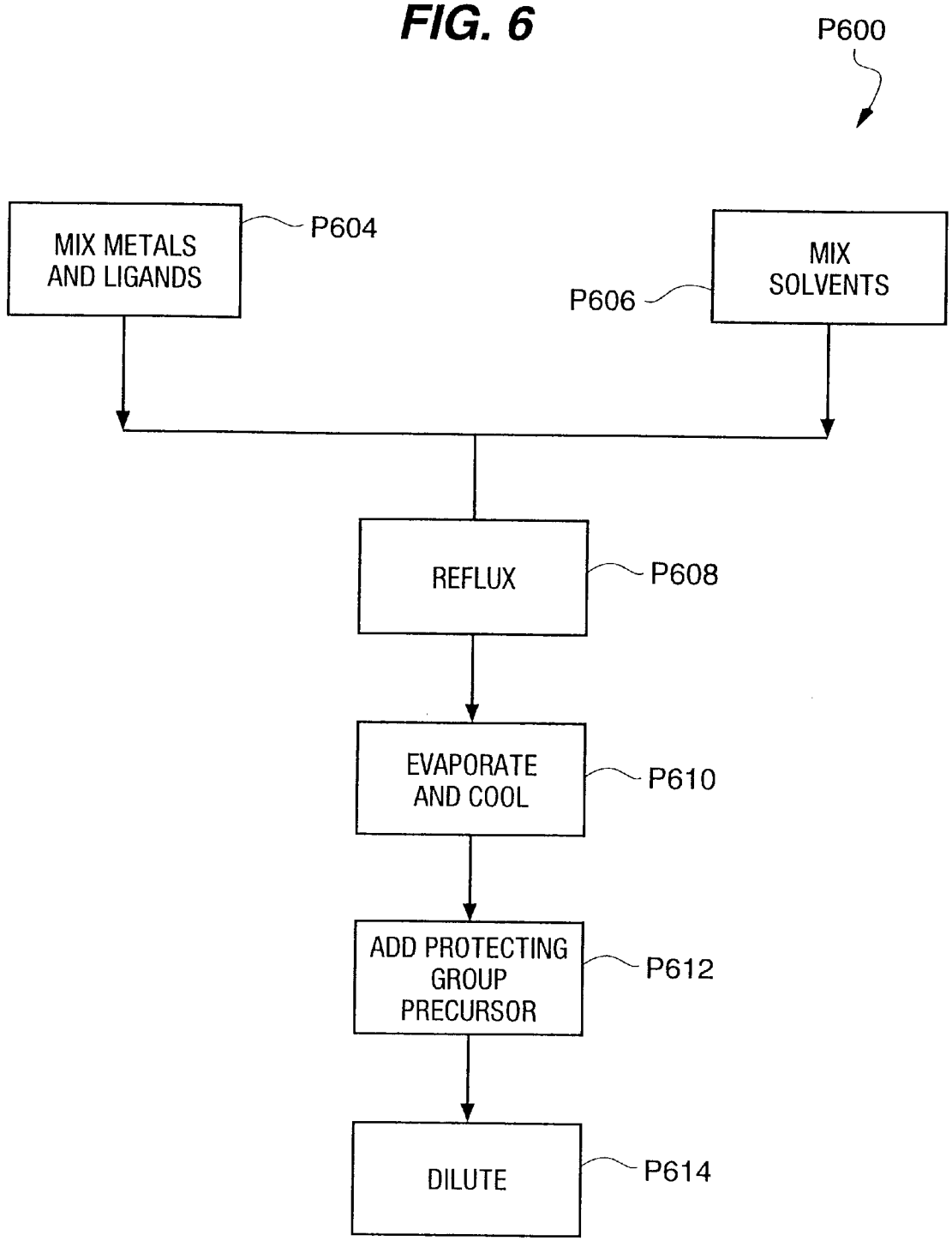
FIG. 6 depicts a schematic process diagram of a process for making solutions including molecules as shown in FIGS. 1 and 2.

FIG. 6 depicts a process schematic diagram P600 showing additional detail for step P504 of FIG. 5, i.e., the preparation of the photosensitive liquid solution. Step P604 includes providing a metal or a plurality of metals bonded to ligands (L in FIGS. 1, 2 and 3) selected from the group consisting of alkoxides, β-diketonates, β-ketoesters, carboxylates, and mixtures thereof. Metal alkoxides are most preferred. The materials obtained in step P604 may be purchased on commercial order from such companies as Aldrich Chemical Company of Milwaukee, Wis., or formed in conventional reactions between the metals and corresponding alcohols, β-diketones, β-ketoesters, and carboxylic acids.

Any metal can be used in a reaction to form the desired metal alkoxides, β-diketonates, β-ketoesters, and carboxylates, which are provided in step P604. Metals are conventionally known to react with alcohols in forming a metal alkoxide. The β-diketones, β-ketoesters, and carboxylic acids can be further reacted with the metal alkoxides to substitute for alkoxide ligands of the metal alkoxides. Specific metals for practicing the present invention include the transition metals, especially, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals, especially, cerium, praseodymium, neodymium, promethium, samarium, europium, gadolinium, terbium, dysprosium, holmium, erbium, thulium, ytterbium, and lutetium; the rare earth metals including calcium, strontium, barium, and radium; and the alkali metals including lithium, sodium, potassium, rubidium, cesium, and francium. Other metals for use in the present invention include magnesium, zinc, cadmium, aluminum, gallium, indium, thallium, germanium, lead, tin, antimony, and bismuth. Nonmetallic elements including selenium, tellurium, phosphorous, silicon, and boron are also useful as M in the present invention. Especially preferred metals include those that are used to form perovskites and layered superlattice materials, e.g., strontium, barium, zirconium, bismuth, lead, niobium, tantalum, tungsten, titanium, and other metals having similar radii and valences.

The metals of step P604 are selected to provide a metal oxide having a desired stoichiometry upon annealing of the final photosensitive solution. Thus, a photosensitive solution designed to yield the complex metal oxide $(Ba_{0.7}Sr_{0.3})TiO_3$ would have 0.7 parts of $Ba^{2+}$ metal, 0.3 parts of $Sr^{2+}$ metal, and one part $Ti^{4+}$ metal. Particularly useful complex metal oxides include ferroelectrics and high dielectrics. Most perovskites and layered superlattice materials are high dielectrics. Many of these materials are also ferroelectric.

Layered superlattice materials are preferred for use as ferroelectric due to their extremely low level of polarization fatigue. These materials include those such as the strontium bismuth tantalate materials discussed in U.S. Pat. No. 5,434,102. Layered superlattice materials are normally ferroelectric, and are also high dielectrics.

The term "layered superlattice material" is used herein because no well-defined accepted term exists in the art to describe these type of materials. Layered superlattice materials at least include all three of the Smolenskii-type ferroelectric layered superlattice materials, namely, those having the respective average empirical formulae:

$$A_{m-1}S_2B_mO_{3m+3}, \quad (4)$$

$$A_{m+1}B_mO_{3m+1}, \quad (5)$$

and $$A_mB_mO_{3m+2}, \quad (6)$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number in the overall formula, the formula typically provides for a plurality of different or mixed perovskite-like layers each having a different integer value. The A-site metals and B-site metals may include mixtures of cations having similar ionic radii. Particularly preferred layered superlattice materials include those which are deficient in A-site metals.

The superlattice-generator layers, S, include oxides of bismuth (III) other similarly sized trivalent metal cations such as thallium (III). Bismuth also functions as an A-site metal in the perovskite-like lattice if it is present in excess of the stoichiometrically required amount for generating the layered superlattice material according to Formula (4). The most preferred layered superlattice materials include strontium bismuth tantalate, strontium bismuth niobate, and strontium bismuth niobium tantalate. Additionally, it can be advantageous to provide these materials with a mixture of B-site elements including vanadium and tungsten. Bismuth titanate is a layered superlattice material wherein bismuth is both the superlattice generator element and the A-site metal.

The layered superlattice material-forming solutions include a plurality of metals that will be incorporated in the metal oxide, but do not necessarily need to be mixed in the exact stoichiometric proportions of the metal oxide. Vapor losses sometimes occur during the anneal. Thus, the solutions should be compensated for anticipated vapor losses in high vapor loss elements, such as bismuth. When bismuth is added to the solution, a five to ten percent excess quantity of bismuth is preferred to compensate the solution for anticipated vapor loss of bismuth. Atmospheric oxygen supplements the oxygen in solution during the anneal. Thus, the liquid solution does not need to supply all of the required oxygen.

Perovskites are preferred for use as high dielectrics. Lead zirconium titanate and lead lanthanum zirconium titanate are preferred perovskites. Barium strontium titanate is most preferred. The barium strontium titanate formulation is $$(Ba_xSr_{1-x})TiO_3, \quad (7)$$

wherein X is a number from zero to one. The variation of X between zero and one controls the ferroelectric Curie temperature and the dielectric constant. Circuit designers can, accordingly, use Formula (1) to design materials having optimum performance in an intended environment of use. Barium strontium titanate materials having an X value equal to or greater than about 0.7 are generally considered to be high dielectrics alone, and materials having an X value of less than about 0.6 begin to exhibit useful ferroelectricity at integrated circuit operating temperatures. The most preferred formulation of barium strontium titanate is $(Ba_{0.7}Sr_{0.3})TiO_3$, which is not ferroelectric at the normal operating temperatures for integrated circuits. The metal organic portion of liquid solutions used to make perovskites preferably includes strontium, barium, titanium, lead, zirconium, or lanthanum, as well as mixtures of these metals.

Step P606 includes preparing a solvent. Preferred solvents for use in step P606 include xylenes, 2-methoxyethanol, 2-methoxy-2-propanol, methylcyclohexane, n-octane, and n-decane. 2-methoxyethanol is preferred as a cosolvent because its polar nature enhances the solubility of reagents and reaction products; however, 2-methoxyethanol is a carcinogen and must be used with great caution. Other cosolvents include n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, and 3-pentanol. The most preferred solvent is 1-methoxy-2-propanol because it provides superior solution film qualities that lead to improved step-coverage when the photosensitive solution is deposited on a substrate.

An anhydride stabilizing agent may also be added in step P606 to eliminate water and prevent polymerization of metal alkoxides in solution until subsequent reactions in the manufacturing process substantially eliminate alkoxide ligands from solution. The addition of an anhydride scavenges water from the reaction mixture as the solution is being made, and prevents premature condensation polymerization. The anhydride is preferably a short-chain anhydride having fewer than ten carbon atoms.

In step P608, the ingredients corresponding to steps P604 and P606 are mixed together. The mixture is refluxed for at least three hours at a temperature ranging from 100° C. to 130° C. This refluxing facilitates the reaction between any metals, alcohols, β-diketones, β-ketoesters, and carboxylic acids to yield corresponding metal alkoxides, metal β-ciketonates, metal β-ketoesters, and metal carboxylates.

Evaporation step P610 is performed by placing the hot solution at 50° C. to 120° C. under a partial vacuum relative to atmospheric pressure for removal of a portion of the solvent from step P606. It is preferred to conduct step P608 at a temperature greater than 100° C. or the boiling point of water because this temperature assures elimination of solution water and low boiling point organics that may be introduced to the solution as contaminants or reaction byproducts. The long reaction time of refluxing in step P608 combined with elimination of alcohol byproducts through evaporation drives any reactions to substantial completion. Short chain alcohol byproducts are also removed because their presence promotes esterification, which is associated with the production of water and consequent gelling of metal alkoxide solutions. The molarity of the solution at this time may vary, but it is recommended that the solution be kept as concentrated as possible while solubilizing all of the reagents and products. The evaporated mixture is allowed to stand to room temperature.

Figure 7:
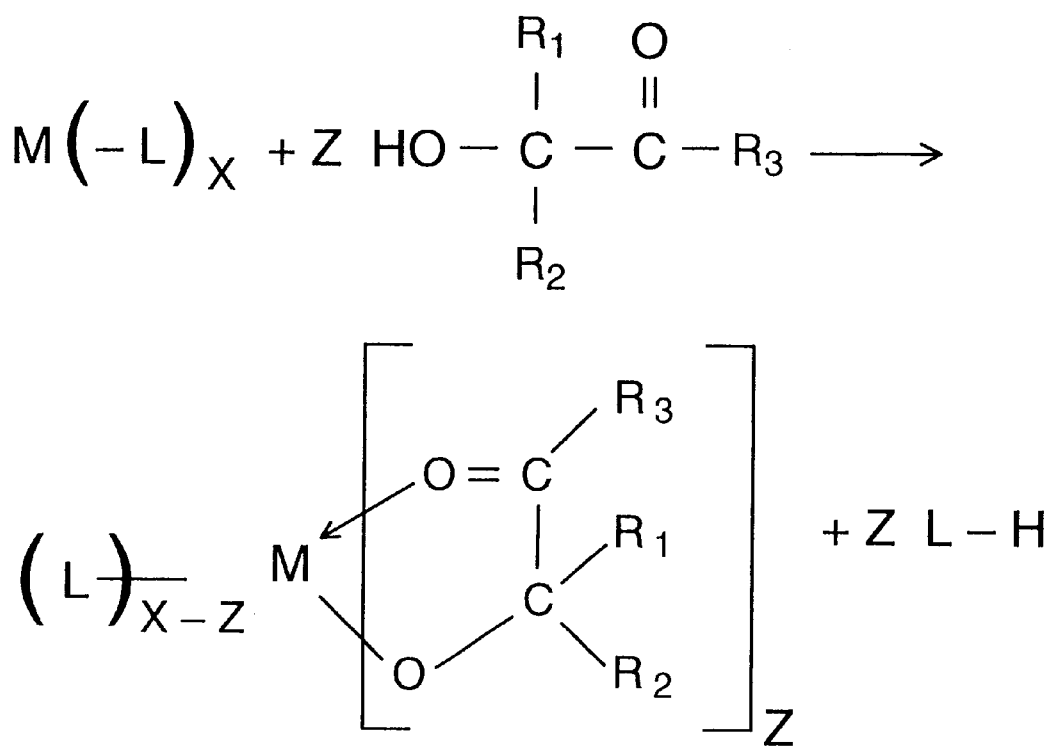
FIG. 7 depicts a chemical reaction in which a protecting group precursor is substituted for a ligand that is initially bonded to as metal.

Step P612 includes the addition of a protecting group precursor. The most preferred protecting group precursors are 1-phenyl-2-hydroxy-2-methylpropyl-1-one, 1-phenyl-2-cyclohexyl-1-one, and 2-phenyl-2-dimethyl-2-methyl-2-propyl-1-one. The protecting group precursors substitute for ligands in the metal alkoxides, metal β-diketonates, metal β-ketoesters, and metal carboxylates in solution, as shown in FIG. 7 wherein the terms M, L, Z, $R_1$, $R_2$, and $R_3$ are defined above. The reaction shown in FIG. 7 proceeds for the formation of a molecule according to FIG. 1. A similar reaction proceeds to form a molecule according to FIG. 2 where the corresponding protecting group precursor has a similarly reactive hydroxy group.

Step P614 includes dilution of the solution by adding solvent. The solvent is preferably an anhydrous polar organic solvent, such as 2-methoxyethanol, which best solubilizes the reaction product. It is preferred to dilute the solution to a molarity of 0.05 mole percent to 0.5 mole percent. This dilution or molarity adjustment enhances the substrate-coating ability of the liquid solution. In this sense, the term "molarity" means the number of moles of the empirical formula of the desired metal oxide that may be produced in the anneal of step P518 (see FIG. 2) from a single liter of solution. It is advantageous to standardize a variety of solutions to a common molarity because one solution will then behave much like another in producing films of consistent quality and thickness without having to alter or optimize other process parameters, e.g., the soft bake, postbake, drying and anneal steps corresponding to numbers P508, P511, P516, and P518 of FIG. 5. The diluted solution after step P514 may be shipped and stored for long periods of time, e.g., up to a year or more.

The following non-limiting examples set forth preferred materials and methods for practicing the present invention.

EXAMPLE 1

Production of a 0.14 M Metal-Alkoxycarboxylate Phenylketonate Solution Designed to Yield $Sr_{0.8}Bi_{2.2}(Nb_{0.56}Ta_{1.44})O_{9.1}$ Solution ingredients were measured as set forth in Table 1 for use in preparing a precursor solution according to step P504 of FIG. 5. These ingredients were used to make a liquid precursor solution capable of forming a perovskite-like layered superlattice material having an average formula of $Sr_{0.8}Bi_{2.2}(Nb_{0.56}Ta_{1.44})O_9$ upon annealing of a solution film in oxygen. The procedure of this example was conducted at atmospheric pressure in a laboratory at Symetrix Corporation in Colorado Springs, Colo.

TABLE 1

| PRECURSOR REAGENTS | | | | |
|---|---|---|---|---|
| Compound | FW | g | mmole | Equiv. |
| Tantalum (V) ethoxide | 406.25 | 11.70 | 28.8 | 1.44 |
| Niobium (V) ethoxide | 318.21 | 3.564 | 11.2 | 0.56 |
| 1-methoxy-2-propanol | 90.12 | 40 ml | 408 | — |
| 2-ethylhexanoic acid | 144.21 | 30.0 | 208.0 | — |
| Strontium | 87.62 | 1.402 | 16.0 | 0.80 |
| Bismuth 2-ethylhexanoate (in 22% octane) | 949.77 | 41.79 | 44.0 | 2.20 |

In Table 1, "FW" indicates formula weight, "g" indicates grams, "mmoles" indicates millimoles, and "Equiv." indicates the equivalent formula molarity corresponding to the empirical formula $Sr_{0.8}Bi_{2.2}(Nb_{0.56}Ta_{1.44})O_{9.1}$. It is noted that a 10%(or 0.20 mole) excess amount of bismuth has been added to compensate for bismuth volatilization losses that are anticipated in the anneal step P518 of FIG. 5. An oxygen environment in the anneal step also supplies whatever portion of the oxygen $O_{9.1}$ in the empirical formula that the solution does not supply. Thus, the metals Sr, Bi, Nb, and Ta are mixed in proportions that are intended to yield, upon annealing of the solution with volatilization of bismuth, a solid metal oxide having the empirical formula $Sr_{0.8}Bi_{2.2}(Nb_{0.56}Ta_{1.44})O_{8.8}$.

An Erlenmeyer flask equipped with a reflux condenser was used to combine the strontium (1.402 g) for reaction with a large excess amount (40 ml) of 1-methoxy-2-propanol to form a reaction mixture. Tantalum (V) ethoxide (11.70 g) and niobium (V) ethoxide (3.564 g) were combined with the reaction mixture. The reaction mixture was refluxed with magnetic stirring at 120° C. for three hours to dissolve and react the strontium metal with the 1-methoxy-2-propanol. The 2-ethylhexanoic acid (30.0 g) was added to the hot reaction mixture, which was again refluxed at 130° C. for an additional three hours. This second refluxing assisted an exothermic substitution of 2-ethylhexanoate ligands for alkoxide ligands on the respective metals. This substitution produced metal alkoxycarboxylates. The reaction mixture was evaporated at a temperature ranging from 50° C. to 120° C. under aspiration vacuum to remove about 20 ml of solvent. The solution stood for cooling to room temperature. The bismuth-2-ethylhexanoate (41.79 g) was added along with 40 mmol of 1-phenyl-2-cyclohexyl-1-one and sufficient 1-methoxy-2-propanol to adjust the solution yield to 0.14 mmol of $Sr_{0.8}Bi_{2.20}(Nb_{0.56}Ta_{1.44})O_{9.1}$. per kg.

EXAMPLE 2

Production of a 0.14 M Metal-Alkoxy β-Diketonate Phenylketonate Solution Designed to Yield $Sr_{0.8}Bi_{2.2}(Nb_{0.56}Ta_{1.44})O_{9.1}$ The procedure of Example 1 was repeated in an identical manner, except a 200 mmol quantity of 2, 2, 6, 6-tetramethyl-3, 5-heptanedione was used in place of the 208 mmol quantity of 2-ethylhexanoic acid from Example 1.

EXAMPLE 3

Production of a UV-Patterned Film Using a Metal Alkoxide Bonded to a Protecting Group for Inhibition of Hydrolysis The solution of Example 1 is used to produce a thin film capacitor including a dielectric layer of $Sr_{0.8}Bi_{2.2}(Nb_{0.56}Ta_{1.44})O_{9.1}$ according to process P500 of FIG. 5. A conventional substrate formed of a silicon wafer having an oxide layer and a sputter-deposited platinum/titanium electrode is placed in a standard spin-coating machine. About two ml of the 0.14 mol/kg strontium bismuth niobium tantalate solution of FIG. 1 is applied to the substrate using an eyedropper while the substrate spun at 500 rpm. Revolution speed is increased to 1500 rpm for an additional thirty seconds to provide a film of the liquid precursor covering the electrode.

The liquid-coated precursor is soft-baked by placement on a hot plate heated to 150° C. in air for one minute. The soft-baked film is irradiated under a mask by exposure to low pressure mercury-source ultraviolet radiation having a wavelength of about 254 nm. Cumulative irradiation energy is about one Joule to promote decompositon of the ligand in the film. Post-bake in air on a hot plate heated to 150° C. establishes a final polymerized pattern in the solution film.

The pattern is developed by placing the ultraviolet-exposed substrate in an agitation bath containing mineral spirits. The bath is agitated with mild motion for thirty seconds to develop the exposed negative pattern. The developed substrate is placed in a rinse bath containing n-butylacetate and mildly agitated for thirty seconds. After rinsing, the substrate is blown with a nitrogen air gun, placed on a hot plate at 140° C. for one minute, and subjected to rapid thermal processing for thirty seconds at 650° C. under an oxygen flow.

The steps of depositing the precursor, soft-baking, irradiating, developing, rinsing, and drying were repeated one time to increase the patterned film thickness.

The dried, patterned film is annealed in an oxygen diffusion furnace at 750° C. for one hour and twenty minutes including ten minutes each for the ramp into the furnace and the ramp out of the furnace. The device is completed by sputtering a platinum top electrode and patterning the top electrode using a conventional reactive ion etching procedure to form a plurality of integrated circuit capacitor devices on the wafer. Each capacitor device had an area of 1960 $\mu m^2$ and an film thickness of about 2300Å.

Those skilled in the art understand that the preferred embodiments described above may be subjected to apparent modifications without departing from the true scope and spirit of the invention. The inventors, accordingly, hereby state their intention to rely upon the Doctrine of Equivalents, in order to protect their full rights in the invention.

We claim:

1. A method of photopatterning a thin film for use in integrated circuits, said method comprising the steps of:

providing a photosensitive solution comprised of a solvent and a photosensitive material comprising a photodecomposable organic compound containing an aryl group bonded directly to a ketone group and an alkoxide group bonded with the oxygen being alpha to the ketone group where a metal is chelated through both the ketone and alkoxide groups;

forming a solution film of said photosensitive solution on a substrate;

soft-baking said solution film;

exposing said solution film to a masked pattern of ultraviolet radiation to provide a film having an initial pattern;

developing said final pattern;

annealing said final pattern to yield a solid thin film metal oxide; and completing an integrated circuit formed around said solid thin film metal oxide.

2. The method as set forth in claim 1 wherein said step of providing said photosensitive solution includes providing said photosensitive material having a molecular formula

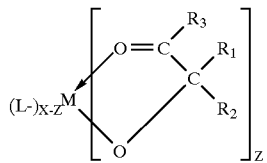

wherein M is said metal having a valence X; Z is an integer less than or equal to X; L is an alkoxy, carboxylate, β-ditetonate, or β-ketoester ligand having from one to eleven carbon atoms; $R_1$ and $R_2$ are selected from the group consisting of alkyl and alkenyl groups each having from one to eleven carbon atoms, and hydrogen; and $R_3$ is aryl.

3. The method as set forth in claim 1 wherein said step of providing said photosensitive solution includes providing said photosensitive material having a molecular formula

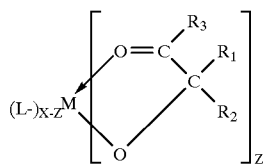

wherein M is said metal having a valence X; Z is an integer less than or equal to X; L is an alkoxy, carboxylate, β-ditetonate, or β-ketoester ligand having from one to eleven carbon atoms; $R_1$ and $R_2$ are selected from the group consisting of alkyl and alkenyl groups each having from one to eleven carbon atoms, and hydrogen; and $R_3$ is aryl.

4. The method as set forth in claim 1 wherein said step of providing said photosensitive solution includes providing said photosensitive material having a molecular formula

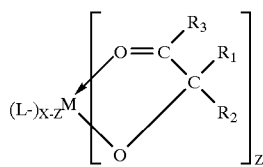

wherein M is said metal having a valence X; Z is an integer less than or equal to X; L is an alkoxy, carboxylate, β-ditetonate, or β-ketoester ligand having from one to eleven carbon atoms; $R_1$ and $R_2$ are selected from the group consisting of alkyl and alkenyl groups each having from one to eleven carbon atoms, and hydrogen; and $R_3$ is aryl.

5. The method as set forth in claim 1 wherein said step of forming a solution film of said photosensitive solution on a substrate includes spinning said photosensitive solution onto said substrate.

6. The method as set forth in claim 1 wherein said step of soft-baking said solution film includes heating said substrate and said solution film to a temperature ranging from 80° C. to 160° C. for one to three minutes.

7. The method as set forth in claim 1 wherein said step of exposing said solution film to a masked pattern of ultraviolet radiation includes exposure to deep ultraviolet radiation having a wavelength ranging from 250 nm to 300 nm to obtain a total energy delivery of at least about 500 miliJoules.

8. The method as set forth in claim 1 wherein said step of developing a final pattern includes use of an apolar developer solution.

9. The method as set forth in claim 8 wherein said developer solution is selected from the group consisting of mineral spirits and octane.

10. The method as set forth in claim 1 wherein said step of annealing said final pattern includes heating said final pattern to a temperature ranging from temperature ranging from 600° to 850° C.

11. The method as set forth in claim 1 wherein said step of providing said photosensitive solution comprised of said solvent and said photosensitive material includes providing a plurality of such photosensitive materials having different metals in relative proportions corresponding to a desired yield of a complex metal oxide from said photosensitive solution upon said step of annealing said final pattern.

12. The method as set forth in claim 11 wherein said complex metal oxide is a layered superlattice material.

13. The method as set forth in claim 12 wherein said layered superlattice material is selected from the group consisting of strontium bismuth tantalate and strontium bismuth niobium tantalate.

14. The method set forth in claim 11 wherein said complex metal oxide is a perovskite.

15. The method solution as set forth in claim 14 wherein said perovskite is barium strontium titanate.

16. The method as set forth in claim 1 wherein said step of post-baking said film includes heating said film to a temperature ranging from 80° C. to 160° C. for a time ranging from 30 seconds to 180 seconds.

* * * * *

UNITED STATES PATENT AND TRADEMARK OFFICE
CERTIFICATE OF CORRECTION

PATENT NO. : 5,942,376
DATED : August 24, 1999
INVENTOR(S) : Hiroto Uchida et al.

It is certified that error appears in the above-identified patent and that said Letters Patent is hereby corrected as shown below:

Col. 13, line 40
replace "developing said final pattern;"
with --developing a final pattern;--.

Signed and Sealed this

Twenty-first Day of March, 2000

Attest:

Q. TODD DICKINSON

Attesting Officer

Commissioner of Patents and Trademarks